US010468112B1

(12) United States Patent
Eno

(10) Patent No.: US 10,468,112 B1
(45) Date of Patent: Nov. 5, 2019

(54) DISTURB-OPTIMIZED CODEWORD LAYOUT

(71) Applicant: Micron Technology, Inc., Boise, ID (US)

(72) Inventor: Justin Eno, El Dorado Hills, CA (US)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

(21) Appl. No.: 16/101,263

(22) Filed: Aug. 10, 2018

(51) Int. Cl.
| | |
|---|---|
| *G11C 16/04* | (2006.01) |
| *G11C 16/34* | (2006.01) |
| *G11C 11/56* | (2006.01) |
| *G11C 16/10* | (2006.01) |

(52) U.S. Cl.
CPC ...... *G11C 16/3427* (2013.01); *G11C 11/5628* (2013.01); *G11C 16/0483* (2013.01); *G11C 16/10* (2013.01)

(58) Field of Classification Search
CPC . G11C 16/3427; G11C 16/10; G11C 16/0483; G11C 11/5628
USPC .................................................... 365/185.02
See application file for complete search history.

(56) References Cited

U.S. PATENT DOCUMENTS

| | | | | |
|---|---|---|---|---|
| 7,505,318 B2* | 3/2009 | Fukuda | ............. | G11C 16/0483 365/185.09 |
| 8,587,997 B2* | 11/2013 | Kim | .................. | G11C 16/3427 365/185.02 |
| 9,450,610 B1* | 9/2016 | Micheloni | .......... | G06F 11/1072 |
| 2009/0034337 A1* | 2/2009 | Aritome | ............. | G11C 11/5642 365/185.18 |
| 2013/0145235 A1* | 6/2013 | Alhussien | .......... | G06F 11/1008 714/773 |
| 2014/0281828 A1* | 9/2014 | Micheloni | .............. | G06F 11/00 714/773 |

* cited by examiner

*Primary Examiner* — Tha-O H Bui
(74) *Attorney, Agent, or Firm* — Nicholson De Vos Webster & Elliott LLP

(57) ABSTRACT

A first bit of an aggressor codeword is written to a first memory cell, wherein the write to the first memory cell disturbs a set of one or more victim codewords by contributing to a cumulative effect that can change a value of a victim codeword in the set based on proximity to the first memory cell. A second bit of the aggressor codeword is written to a second memory cell, wherein the write to the second memory cell disturbs at most the one or more victim codewords of the set by contributing to the cumulative effect based on proximity to the second memory cell. The second memory cell is separated from the first memory cell by at least a third memory cell, wherein the third memory cell stores a first bit of a second codeword.

20 Claims, 7 Drawing Sheets

US 10,468,112 B1

DISTURB-OPTIMIZED CODEWORD LAYOUT

TECHNICAL FIELD

The various embodiments described in this document relate to data disturbance in a computer memory, and more specifically, relate to managing the memory using a disturb-optimized codeword layout.

BACKGROUND ART

A memory subsystem can be a storage system, such as a solid-state drive (SSD), and can include one or more memory components that store data. The memory components can be, for example, non-volatile memory components and volatile memory components. In general, a host system can utilize a memory subsystem to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
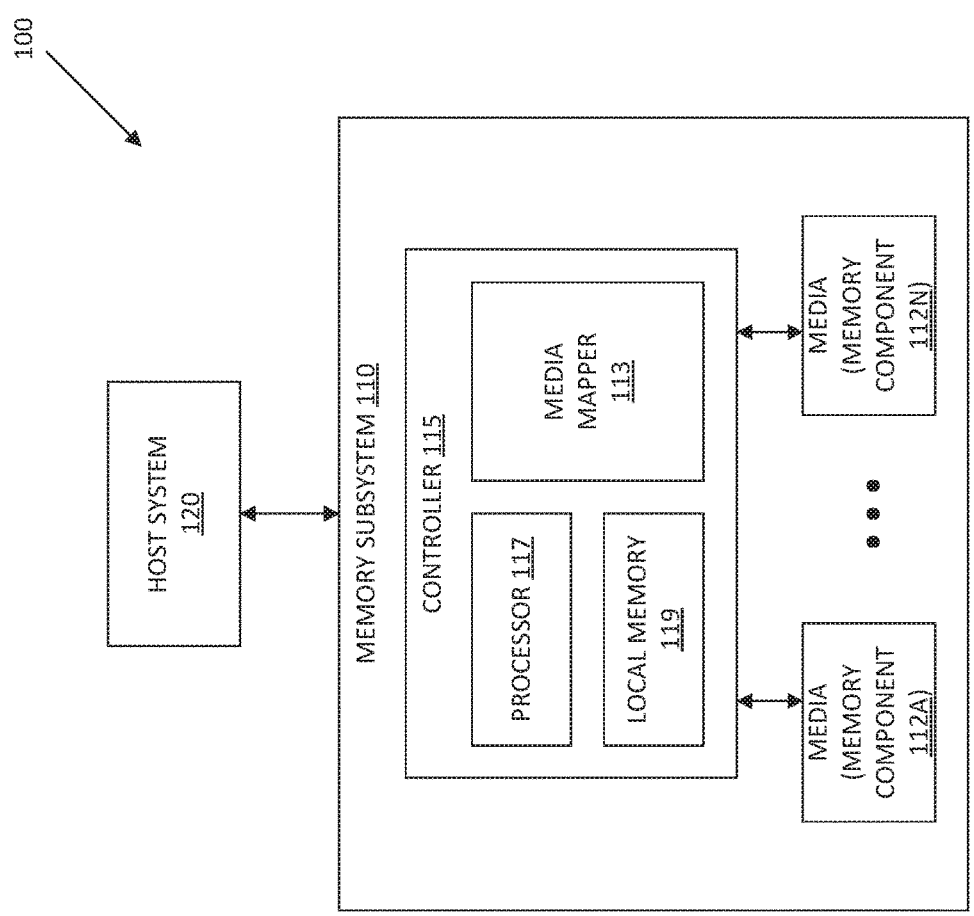
FIG. 1 illustrates an example computing environment that includes a memory subsystem in accordance with some embodiments of the present disclosure.

Aspects of the present disclosure are directed to mapping codewords to memory to minimize disturbance in a memory subsystem. A memory subsystem is also hereinafter referred to as a "memory device." An example of a memory subsystem is a storage system, such as a solid-state drive (SSD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

Disturbance is an undesirable side effect associated with dense (in terms of bits per unit area) memory devices. Memory devices include large numbers of arrays of memory cells, such as memory cells arrayed in 4,096 rows by 4,096 columns. As memory cell density increases, changes in temperature, electric or magnetic fields, or other effects associated with an access to one cell (an aggressor) can disturb the data stored in other neighboring cells (victims). The effect on victims accumulates over a series of accesses to an aggressor and can cause the values stored in the victims to change (e.g., from "1" to "0" or vice versa). To mitigate disturbance as a side effect, memory subsystems track the amount of accumulated disturbance and periodically rewrite the data stored in victims whose accumulated disturb has reached a threshold, e.g., of accesses to an aggressor cell. Tracking disturbance is not desirable at the memory cell level as each cell may require more memory to track accumulated disturbance than the cell provides in data storage (e.g., a cell storing a single bit might require four memory cells that can represent a disturb level between 0 and 16). As such, memory devices track disturbance by larger blocks of data written to or read from groups of memory cells. One such block of data is a codeword. Codewords combine user data (e.g., files the user stores on the memory device) with control data that the memory device can use to improve data storage (e.g., error correcting codes to improve the reliability of the storage). As logical units, codewords can be arbitrarily sized relative to the underlying physical characteristics of the memory, such as the size of the arrays of memory cells. As a result, the mapping or layout of codewords within a memory device presents significant challenges in ensuring significant amount of memory do not go unused while minimizing the complexity of the disturbance relationships between aggressors and victims to reduce the complexity of the remediation process.

Aspects of the present disclosure address the above and other problems by dividing up codewords, arrays of memory cells, groups of arrays of memory cells, or the memory die and, in some cases, introducing "dummy" memory cells that do not store data to minimize the effects of disturbance. Divided portions of codewords are laid out on the memory die such that each portion of the codeword does not introduce additional codeword neighbors beyond an ideal maximum number of disturb relationships. For example, codeword A might be divided into two portions, A1 and A2. Writing portion A1 to a first region of the memory device disturbs neighboring codewords B, C, D, and E for a maximum number of disturb relationships of four. Writing portion A2 to a second, different region of the memory device also disturbs codewords B, C, D, and E (or some subset thereof) and does not introduce new neighbor codewords (e.g., codewords F, G, etc.). By carefully selecting how codewords, arrays of memory cells, groups of arrays of memory cells, or the memory die are divided, the disclosed layout techniques maximize the usable amount of memory on the die while minimizing the complexity of the disturbance relationships between codewords.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is a SSD. In some embodiments, the memory subsystem 110 is a hybrid memory/storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

The memory subsystem 110 includes a media mapper component 113 that maps codewords to media 112 by, for example, adjusting the addressing scheme used to translate logical block addresses from the host system to physical block addresses within the media 112. In some embodiments, the controller 115 includes at least a portion of the media mapper component 113. For example, the controller 115 can include a processor 117 (processing device) configured to execute instructions stored in local memory 119 for performing the operations described herein. In some embodiments, the media mapper component 113 is part of the host system 110, an application, or an operating system.

The media mapper component 113 optimizes the layout of arbitrarily sized codewords onto physical memory structures that make up the memory components 112A to 112N. For example, memory components 112A to 112N can include memory dice that include numerous arrays of memory cells. The physical characteristics of these memory arrays (e.g., the number of memory cells in a row or a column) may not align with the size of the codeword. The media mapper components 113 divides up one or more of the codewords, the arrays, groups of arrays of memory cells, and/or the memory dice to maximize the usable amount of memory on the dice while minimizing the complexity of the disturbance relationships between codewords. Further details with regards to the operations of the media mapper component 113 are described below.

The memory components 112A through 112N include one or more dice. In an exemplary embodiment, each die includes 16 partitions, each partition includes 128 arrays of memory cells (e.g., SLCs), and each array of memory cells includes $2^{24}$ memory cells in a 4,096×4,096 grid, with individual memory cells being located at the intersection of a bitline and a wordline. The controller 115 addresses individual memory cells via a bitline and a wordline combination. Exemplary addressing schemes may increment bitlines first or wordlines first. In a wordline-first addressing scheme for a 4,096×4096 array, the memory cell at address zero is located at the intersection of bitline zero and wordline zero, the memory cell at address one is located at the intersection of bitline zero and wordline one, the memory cell at address 4,096 is at the intersection of bitline one and wordline zero, the memory cell at address 4,097 is at the intersection of bitline one and wordline one, etc. In other words, addresses increase/decrease by one along a wordline and, for a 4,096×4096 array, by 4,096 along a bitline.

In some embodiments, the partitions within a die are accessible independent of one another, meaning the controller 115 can activate several partitions simultaneously to concurrently read from or write to different partitions.

In some embodiments, the density of memory cells within a die can cause reads or writes associated with one memory cell to disturb the data stored in another memory cell. Too much disturbance can cause errors in reading the data from a victimized memory cell. To avoid such errors, the controller 115 tracks the amount of disturbance and re-writes the data stored in memory cells whose disturbance is estimated as being close to manifesting an error.

In some embodiments, a write to a memory cell (the aggressor) at a particular wordline and bitline intersection might disturb four adjacent memory cells (the victims) in the array. For example, if the bitline orientation defines a north-south axis, and the wordline orientation defines an east-west axis, the aggressor at a particular wordline-bitline combination potentially disturbs a north victim, a south victim, an east victim, and a west victim. In a wordline-first addressing scheme where west and north correspond to lower numbered wordlines and bitlines, respectively, an access to a memory cell in a 4,096 by 4,096 memory cell array at address 4,097 would disturb the memory cells at address 1 (the western victim); 4,096 (the northern victim); 4,098 (the southern victim); and 8,193 (the eastern victim). An aggressor memory cell may have fewer than four victims, e.g., if it is located at an edge or corner of a memory array or the disturbance effect in one or more directions is insignificant. An aggressor memory cell may have more than four victims, such as when memory cells neighbor aggressor memory cell along an axis orthogonal to both the wordline and bitline (e.g., a z-axis) or when the disturbance effect reaches beyond the immediate north, south, east, and west victims to cells that are not immediately adjacent to or are diagonal to the aggressor within the memory array. Depending on the disturb profile, there is an ideal maximum number of disturb relationships. If the disturb profile is limited to the immediate north, south, east, and west victim cells of a given aggressor, the ideal maximum number of victim memory cells is four.

In one embodiment, the controller 115 packages user data into codewords before writing it to media. A codeword includes some amount of user data and some amount of control data. For example, the controller 115 can expose 512- or 4,096-byte blocks to the host system 120 for user data. The controller 115 encapsulates the user data with additional control data such as error correcting code (ECC) parity bits, cyclical redundancy check (CRC) sums, metadata, etc. Thus, a 512-byte block of user data might be packaged with 256-bytes of control data to form a codeword having a total size of 768-bytes. As described herein, when the size of a codeword exceeds the size of a page, the media mapper component 113 maps codewords to the media to minimize the number of aggressor-victim disturbance relationships.

In some embodiments, partitions have independent disturb domains, meaning a write to a page on one partition does not disturb the corresponding page on another partition. If a page includes memory cells from different arrays within a single partition, an access to the page disturbs the victims on each of the arrays.

To exploit inter-partition access concurrency, the media mapper component 113 maps the codeword to the entire "width" of the memory die, in terms of partitions, and does so for several "rows," in terms of adjacent pages until the entire codeword has been placed. For example, a 24-page codeword is preferably mapped to an 8-partition die on 3 pages of each partition. As another example, a 20-page codeword is preferably mapped to an 8-partition die on 2 pages of each of the 8 partitions and three pages on 4 partitions. As used herein, the term "bulk" refers to the pages that evenly map to the total number of partitions (e.g., the 16 pages that map to each of the 8 partitions in the prior example), and the term "remainder" refers to the excess pages that do not occupy the total number of partitions (e.g., the 4 pages that map to half of the total number of pages in the prior example). Further, because the codeword is mapped to adjacent pages within a partition and written or read as a unit, the controller 115 can ignore the intra-codeword disturbance.

Figure 2:
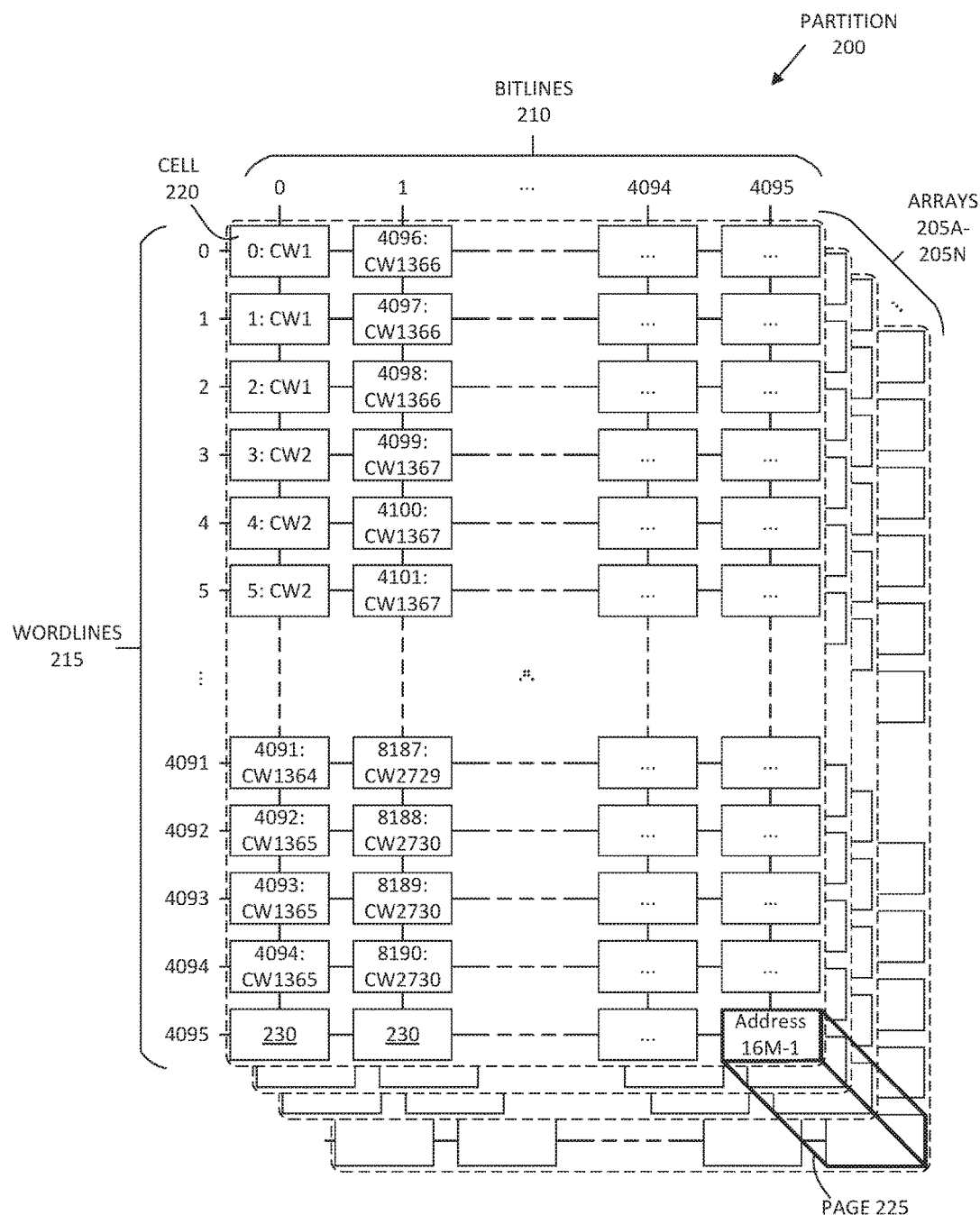
FIG. 2 illustrates an exemplary memory organization and codeword layout of codewords having a size in pages equal to an integer multiple of the number of partitions on a die.

FIG. 2 illustrates an exemplary memory organization and codeword layout of codewords having a size in pages that is equal to an integer multiple of the number of partitions on a die. As indicated, FIG. 2 illustrates a partition 200, which may be one of the 16 partitions in the exemplary memory 112 described above. The partition 200 includes arrays of memory cells 205A-205N, which in the exemplary embodiment number 128. Each array 205 includes 4,096 by 4,096 memory cells 220 located at the intersections of bitlines 210 and wordlines 215. In the illustrated wordline-first addressing scheme, the memory cell at address zero is located at the intersection of bitline zero and wordline zero, the memory cell at address one is located at the intersection of bitline zero and wordline one, the memory cell at address 4,096 is at the intersection of bitline one and wordline zero, the memory cell at address 4,097 is at the intersection of bitline one and wordline one, and the memory cell at address 16,277,215 is at the intersection of bitline 4,095 and wordline 4,095. In this memory organization, the memory cells located at the same address of each array 205 of the partition 200, taken together, form a page 225. With 128 arrays 205 per partition 200 and SLCs, each page can store 128 bits of data. Other memory subsystems may include varying numbers and/or arrangements of memory cells within the die and organizations of memory cells into larger logical groups (e.g., pages).

The media mapper component 113 lays out codewords, which take up some amount of logical space (e.g., pages), on the physical memory components 112. In some embodiments, the size of the codeword evenly maps to the memory structure. For example, the media mapper component 113 could map a codeword with a 48-page footprint (768 bytes divided across 48, 128-bit pages) to three pages on each of the 16 partitions of a die. As illustrated in FIG. 2, a first codeword CW1 spans the first three pages of the partition at addresses 0, 1, and 2, a second codeword CW2 spans the next three pages at addresses 3, 4, and 5, and so on.

Tearing of codewords occurs when, for example, a codeword occupies multiple locations within an array 205 on different bitlines (in wordline-first addressing) or different wordlines (in bitline-first addressing). To avoid tearing of codewords, the media mapper component 113 introduces dummy locations 230. In the illustrated example, the media mapper component 113 prevents placement of data from a codeword at the end of each bitline 210 by designating those locations as dummy locations 230. Thus, the dummy location 230 at the intersection of wordline 4,095 and bitline zero prevents CW1366 from tearing across bitlines 0 and 1. In some embodiments, the dummy location may be at the beginning or somewhere in the middle of a bitline instead of at the end.

Because the controller 115 does not store data in dummy locations 230, the disturbance of aggressors to dummy locations 230 is irrelevant. As a result, the controller 115 can avoid tracking disturbance of the dummy locations 230. Thus, assuming the adjacent North-South, East-West victim disturb relationship described above, accessing any codeword disturbs at most four neighbors, or the ideal maximum size for the disturb relationship. For example, writing CW1367 to addresses 4099-4101 results in four victims (CW1366 to the north, CW2 to the west, CW1368 to the south (not shown), and CW2732 (not shown) to the east).

The layout approach illustrated in FIG. 2 is generally applicable to layouts of codewords on a memory die having P partitions where the size of the codeword (in pages) is equal to X*P pages, where X is an integer number. For wordline-first addressing, the number of dummy locations per bitline is equal to N modulo X, where N is the number of wordlines per bitline (and vice versa for bitline-first addressing). For example, a 16-page codeword on a 16-partition die would map evenly to a single page from each partition with no dummy location (4,096 modulo 1), while a 96-page codeword on a 16-partition die would map so six pages per partition with four dummy locations per bitline (4,096 modulo 6).

Figure 3:
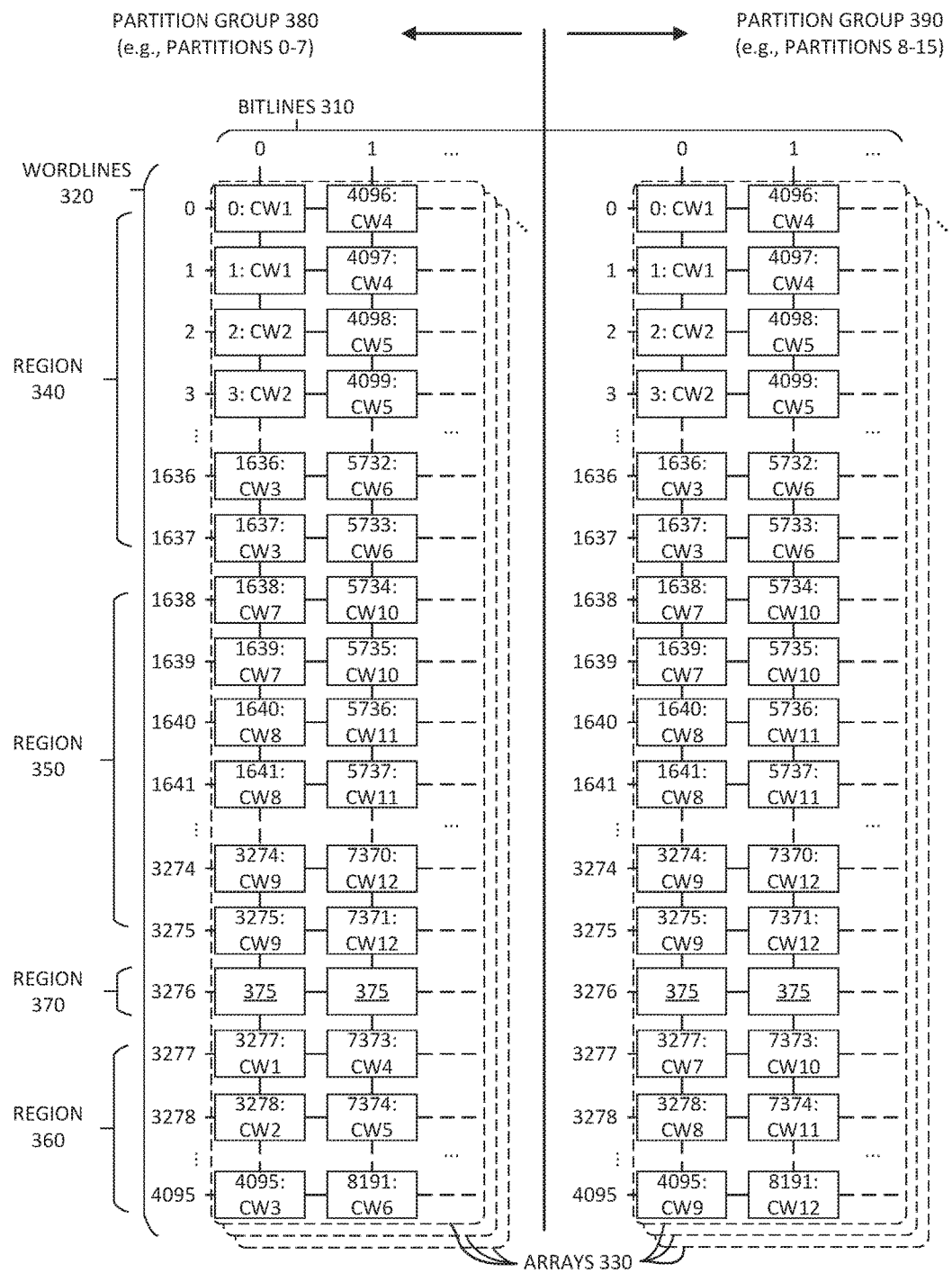
FIG. 3 illustrates an exemplary codeword layout of codewords having a size in pages greater than but not an integer multiple of the number of partitions on a die.

FIG. 3 illustrates an exemplary codeword layout of codewords having a size in pages that is greater than but not an integer multiple of the number of partitions on a die. For example, a 40-page codeword (640 bytes saved on 40, 128-bit pages) could map to a 16-partition die on three pages of 8 partitions and two pages of the remaining 8 partitions. In this manner, the codeword occupies the entire width of the memory die, in terms of partitions, and does so for two rows, in terms of pages. The codeword further occupies half of the width of the die for another row of pages. In this form, a 40-page codeword is "notched" relative to a codeword having a size in pages that is evenly divided by the number of partitions on a die (e.g., a 48-page codeword). Although a 40-page codeword may be mapped to media under the approach illustrated in FIG. 2 by treating the unused portion of the third row as part of the codeword, such an approach would increase the amount of unusable space on the die (e.g., through the use of dummy cells). To avoid increasing the unusable space while minimizing the number of disturbance relationships, the media mapper component 113 can perform the layout approach illustrated in FIG. 3.

As illustrated in FIG. 3, the media mapper component 113 divides the partitions within a memory die into groups 380, 390, divides memory locations within a partition into regions 340, 350, 360, 370, and divides the codeword (e.g., CW1, CW2, etc.) into portions for mapping into the different regions and groups. In an exemplary embodiment that includes 16 partitions per die, the media mapper component 113 divides the partitions into group 380 having partitions 0 through 7 and group 390 having partitions 8 through 15. The media mapper component 113 treats a notched codeword as having two portions: a first "bulk" portion that includes each row, in terms of pages, that spans the full width of the memory die, in terms of partitions, and a second "remainder" portion that includes the partially filled row. In a 40-page notched codeword, in the illustrated embodiment, the bulk portion of the codeword includes two pages of 16 partitions and the remainder portion includes a third page of 8 partitions.

The media mapper component 113 divides partitions into partition groups based on the width of the remainder portion of the codeword, in terms of partitions. Using a 40-page codeword as an example on a 16-partition die, the remainder portion of the codeword spans half of the partitions (8), so the media mapper component 113 divides the partitions into two 8-partition groups 380, 390. The media mapper component 113 also divides pages within a partition (or memory cells within an array) into regions. Regions include a first bulk region 340, a second bulk region 350, a remainder region 360, and a dummy region 370. The height, in wordlines 320, of first bulk region 340 and second bulk region 350 is determined based on the height of a bitline 310 (in wordlines) divided by the "height" of a codeword (the page footprint of the codeword divided by the partition-width of the memory die), rounded down to the nearest integer. For a 40-page codeword, if a bitline has 4,096 wordlines and the number of partitions on a memory die is 16, the height of first bulk region 340 and second bulk region 350 is calculated as follows.

CodewordHeight=2(bulk portion)+8/16(remainder portion)=2.5

Height of Bulk Regions '*7*30, '*7*40=RoundDown (4096/25)=1638

Note that since the bulk portion of the 40-page codeword spans the entire width of the memory die, first bulk region 340 and second bulk region 350 span partition groups 380, 390.

The height, in wordlines 320, of the remainder region 360 is determined based on the height of the bulk regions 340, 350 multiplied by the "height" of the remainder region as follows.

Height of Remainder Region '*7*50=1638*8/16(remainder portion)=819

The height of first bulk region 340 (1638) plus the height of second bulk region 350 (1638) plus the height of remainder region 360 (819) equals 4,095, leaving a single wordline to use as a dummy region 370 to isolate bulk region 350 from remainder region 360, as described below.

Based on these divisions, the media mapper component 113 stores the bulk portion of a codeword separately from the corresponding remainder portion of the codeword. For example, the media mapper component 113 stores the bulk portion of a first codeword CW1 on pages 0 and 1 of partitions 0 through 15, and the corresponding remainder portion of CW1 is stored on page 3277 of partition group 380. Other bulk portions of codewords in bulk region 340 spanning partition groups 380 and 390 have their corresponding remainder portions in remainder region 360 of partition group 380. The media mapper component 113 stores the bulk portion of another codeword CW3 on pages 1636 and 1637 of partitions 0 through 15, and the corresponding remainder portion of CW3 is stored on page 3277 of partition group 390. Other bulk portions of codewords in bulk region 350 spanning partition groups 380 and 390 have their corresponding remainder portions in remainder region 360 of partition group 390.

By dividing the memory die and codewords in this manner, the media mapper component 113 preserves the disturbance relationships amongst codewords such that the ideal maximum number of disturbance relationships is maintained. In short, the disturb neighborhood in the remainder region is a scaled down version of the disturb neighborhood in the bulk region or, in the case of edge or corner memory cells within a region, the number of codeword disturbance relationships does not exceed the ideal maximum number despite the disturb neighborhoods not being identical due to dummy locations or the like. For example, a write to the location marked CW5 in bulk region 340 aggresses CW4 to the north, CW2 to the west, a third codeword to the south (not shown) and a fourth codeword to the east (not shown). In the same manner, the corresponding write to CW5 in remainder region 360 aggresses CW4 to the north, CW2 to the west, the third codeword to the south (not shown) and the fourth codeword to the east (not shown). As another example, a write to the location marked CW1 in bulk region 340 aggresses CW4 to the east and CW2 to the south. The corresponding write to CW1 aggresses CW4 to the east and CW2 to the south. The dummy locations 375 isolate bulk region 350 and remainder region 360. For example, the dummy location 375 to the north of CW1 in remainder region 360 isolates CW1 from CW9 in bulk region 350.

A north/south disturb relationship exists between bulk region 340 and bulk region 350 (at wordlines 1637 and 1638) but not in the remainder region 360 because of disturb isolation between partitions. In other words, a write to CW3 in bulk region 340 disturbs CW7 in bulk region 350 to the south, but the write to CW3 in remainder region 360 does not disturb CW7. This means that certain locations in remainder region 360 experience less disturb than what is accounted for based on the aggressor-victim relationships in bulk regions 340, 350.

Even if the size of the codeword results in bulk and remainder regions that do not allow for the inclusion of a dummy region, ideal maximum number of disturbance relationships is maintained. If the layout illustrated in FIG. 3 did not include the dummy region 370, the extra neighbor would raise the number of disturb relationships from those locations at the edges of the arrays 330 from two or three to three or four, respectively (e.g., CW9 neighbors CW1 to the north).

The layout approach illustrated in FIG. 3 is generally applicable to layouts of codewords on a memory die having P partitions where the size of the codeword (in pages) is equal to X*P pages, where X is a non-integer number greater than one.

While the remainder portion of the 40-page notched codeword evenly split the 16-partition die into two groups, other sized codewords can be split as follows. For example, a 37-page notched codeword has a bulk portion that occupies the entire width of the memory die, in terms of partitions, for two rows, in terms of pages, with a remainder occupying five of the 16 partitions of a third row. Because the remainder portion is $5/16^{th}$ of the width of the die, in terms of partitions, the media mapper component 113 divides partitions into three partition groups (partitions 0-4, partitions 5-9, partitions 10-14), with one partition remaining unused, and divides the partitions into two bulk regions and one remainder region as follows.

CodewordHeight=2(bulk portion)+5/(16−1(unused partition))(remainder portion)=2.333

Height of Bulk Regions=RoundDown(4096/2333) =1755

Height of Remainder Region=1755*5/(16−1(unused partition))=585

Height of Dummy Region=4096−(1755+1755+585) =1

The approach illustrated in FIG. 3 can be extended to accommodate codewords whose remainder portion is greater than one half of the number of partitions on the memory die. For example, a 41-page notched codeword has a bulk portion that occupies the entire width of the memory die, in terms of partitions, for two rows, in terms of pages, with a remainder occupying nine of the 16 partitions of a third row. To avoid the seven remaining partitions in the third row from going unused, the media mapper component 113 divides the 16-partition memory die into two 8-partition "virtual" dice. The media mapper component 113 then treats the 41-page notched codeword as having a bulk portion that occupies the entire width of the virtual memory die, in terms of partitions, for five rows, in terms of pages, with a remainder occupying one of the eight partitions of a sixth row. Because the remainder portion is $1/8^{th}$ of the width of the virtual die, in terms of partitions, the media mapper component 113 divides the eight partitions into eight partition groups, and divides the partitions into five bulk regions and one remainder region as follows.

CodewordHeight=5(bulk portion)+⅛(remainder portion)=5.125

Height of Bulk Regions=RoundDown(4096/5.125) =799

Height of Remainder Region=799*⅛=99

Height of Dummy Region=4096−((5*799)+99)=2

Figure 4:
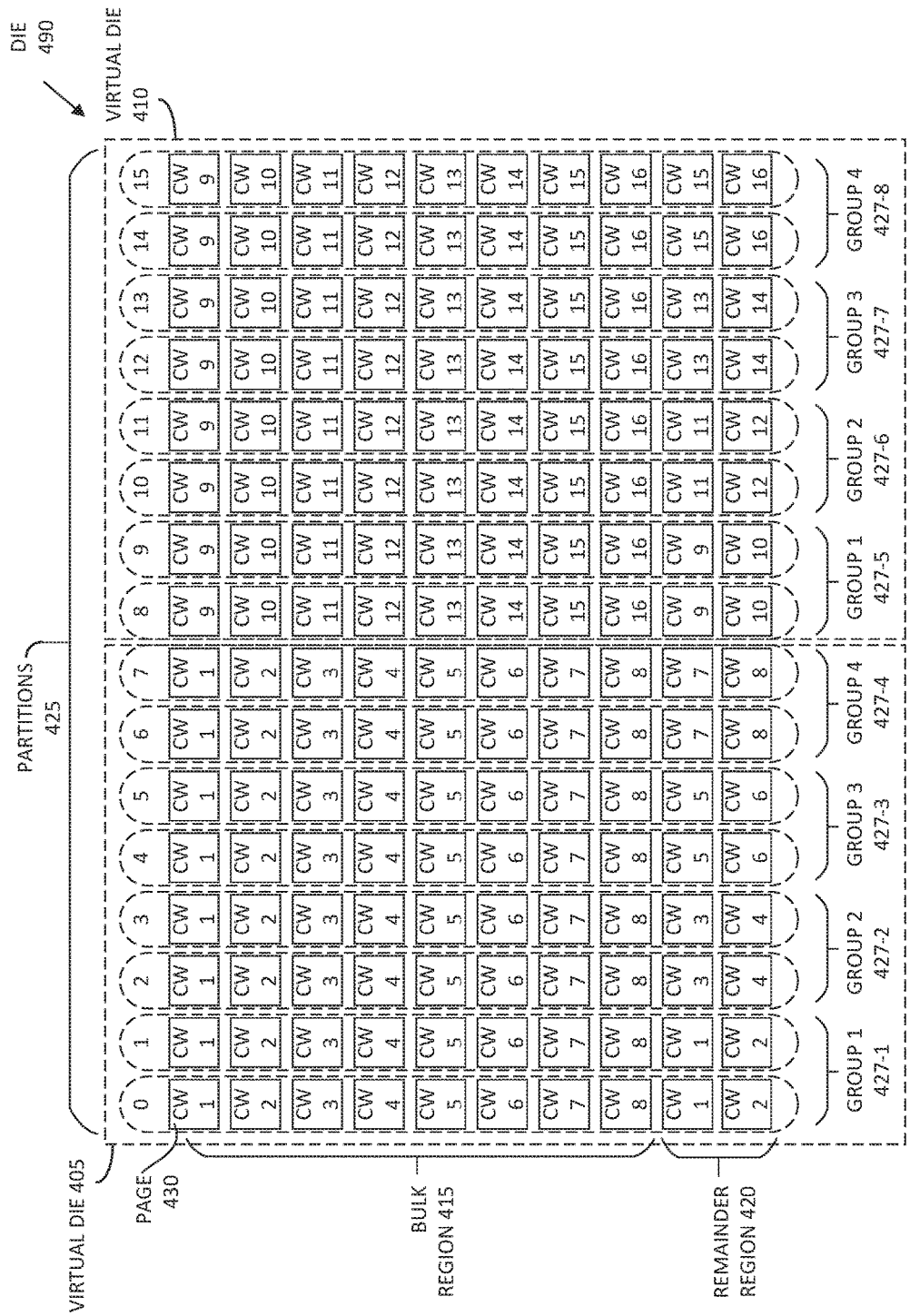
FIG. 4 illustrates an exemplary codeword layout of codewords having a size in pages less than the number of partitions on a die.

FIG. 4 illustrates an exemplary codeword layout of codewords having a size in pages that is less than the number of partitions on a die. For example, a 10-page codeword (160 bytes saved on 10, 128-bit pages) could map to a 16-partition die on one page of 10 partitions. In this manner, the codeword does not occupy the entire width of the memory die, in terms of partitions. In this form, a 10-page codeword is "narrow" in that it requires fewer pages than the number of partitions in a memory die. To reduce the amount of unused space while maintaining an ideal number of neighbor disturb relationships, the media mapper component 113 can perform the layout approach illustrated in FIG. 4. As illustrated in FIG. 4, a memory die 490 includes 16 partitions 425, labeled 0 through 15. Pages 430 are represented by squares, with the individual pages per partition illustrated in a linear, top-to-bottom arrangement rather than in the two-dimensional arrays illustrated in FIGS. 2 and 3. To simplify the illustration, the number of pages per partition has been reduced to ten (rather than 16M). Note that FIG. 4 does not illustrate an east-west disturb relationship between pages (if any): the adjacency of pages in the side-to-side direction does not represent a disturb relationship as each partition constitutes an independent disturb domain.

To map 10-page codewords to the 160-page die 490, the media mapper component 113 divides the 16-partition memory die into the closest factor of N below the width of the narrow codeword, in terms of partitions, where N is the number of partitions on the memory die. For a 10-page codeword, the closest factor of 16 (the number of partitions of the exemplary dice described herein) that is less than 10 (of the 10-page codeword) is 8, so the media mapper component 113 divides memory die into two 8-partition "virtual" dice 405 and 410. In this manner, the 10-page codeword has a bulk portion that occupies the entire width of a virtual die (8 partitions) and a remainder portion that occupies a quarter of the width of the virtual die (2 of 8 partitions). Because the remainder portion is ¼th of the width of the virtual die, in terms of partitions, the media mapper component 113 divides the eight partitions of the virtual into four partition groups 427 of two partitions, and divides the partitions into a bulk region 415 and a remainder region 420 as follows.

$$CodewordHeight = 1 \text{ (bulk portion)} + \frac{1}{4}\text{(remainder portion)} = 1.25$$

$$\text{Height of Bulk Region `} = RoundDown\left(\frac{4096}{1.25}\right) = 3276$$

$$\text{Height of Remainder Region} = 799 * \frac{1}{4} = 819$$

$$\text{Height of Dummy Region} = 4096 - (3276 + 819) = 1$$

In this manner, the bulk portion of one codeword CW1 spans each partition group in virtual die 405 in bulk region 415 and the remainder portion of CW1 spans the first partition group 427-1 of virtual die 405 in remainder region 420. Similarly, the bulk portion of another codeword CW13 spans each partition group in virtual die 410 in bulk region 415 and the remainder portion of CW13 spans the third partition group 427-7 of virtual die 410 in remainder region 420.

As shown in FIG. 4, six partitions of virtual die 405 or 410 contribute one page per codeword and two partitions of the same virtual die contribute two pages per codeword. For example, CW5 includes one page from each of partitions 0-3, 6, and 7, and two pages from partitions 4 and 5. Note that the simplified illustration of FIG. 4 does not show a dummy region that separates the bulk and remainder regions within each partition. In the column arrangement of pages of a partition, the dummy locations would be interspersed within a column (e.g., with reference to FIG. 3: page 3,276; page 7,372; page 11,468; etc.).

The layout approach illustrated in FIG. 4 is similar to the layout approach described above for a 41-page notched codeword.

Figure 5:
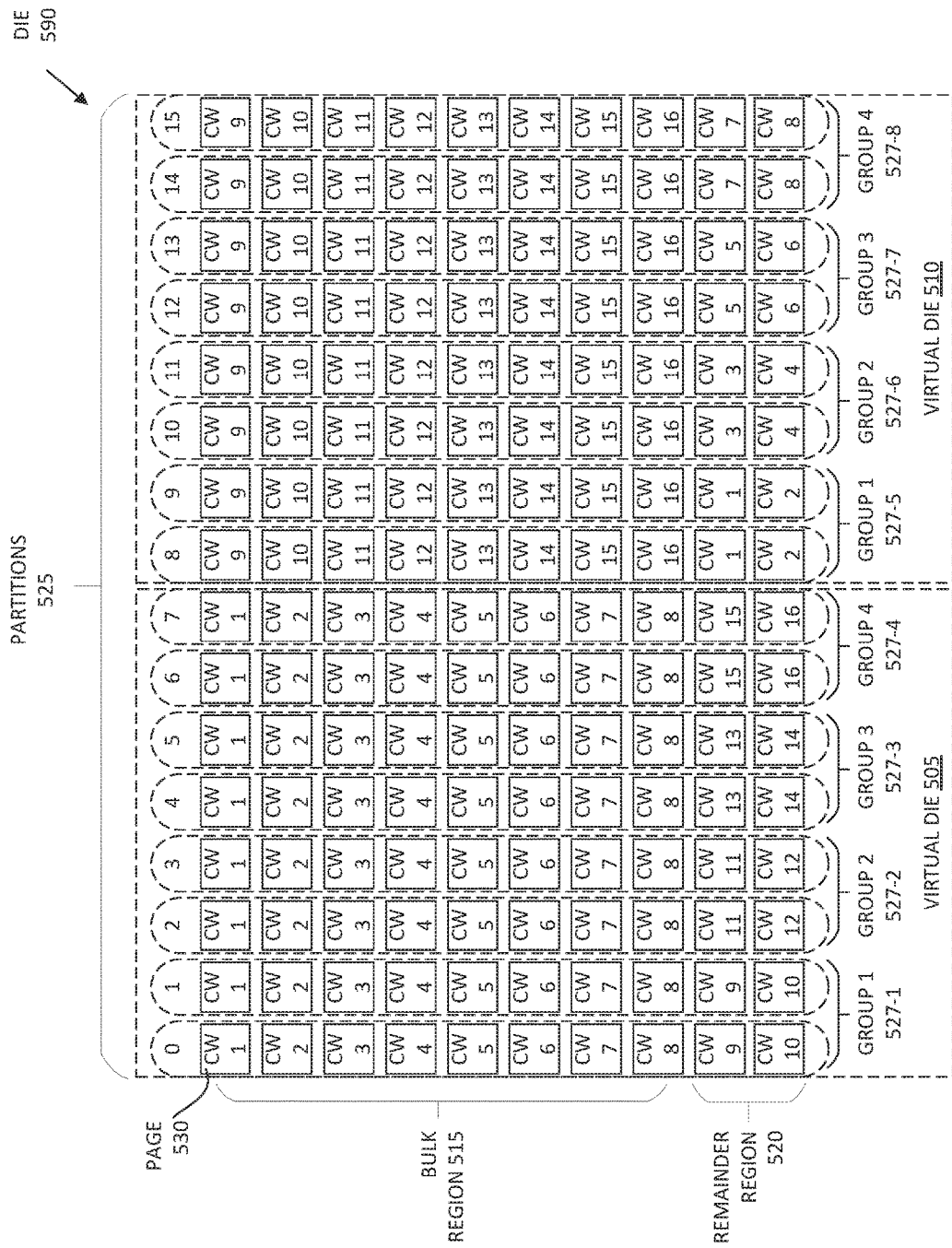
FIG. 5 illustrates another exemplary codeword layout of codewords having a size in pages less than the number of partitions on a die.

FIG. 5 illustrates another exemplary codeword layout of codewords having a size in pages that is less than the number of partitions on a die 590. As indicated above, some embodiments of a memory die include partition-level concurrency, where the controller 115 can activate several partitions simultaneously to concurrently read from or write to pages on different partitions. To improve the performance of the layout described above with reference to FIG. 4, where some partitions included more than one page, the remainder regions 520 of virtual dice 505 and 510 can be rotated such that no partition includes more than one page, as illustrated in FIG. 5. As in FIG. 4, FIG. 5 illustrates a memory die 590 including 16 partitions 525, labeled 0 through 15. Pages 530 are represented by squares, with the individual pages per partition illustrated in a linear, top-to-bottom arrangement rather than the two-dimensional arrays illustrated in FIGS. 2 and 3. To simplify the illustration, the number of pages per partition has been reduced to ten (rather than 16M). As an example of rotating the remainder regions 520 amongst virtual dice 505 and 510, the media mapper component 113 can map the bulk portion of one codeword CW1 to the bulk region 515 in each partition group 527-1 to -4 of virtual die 505 and the remainder portion of CW1 to the remainder region 520 in the first partition group 527-5 of virtual die 510. Thus, codeword CW1 is stored at different pages of different partitions: eight pages of codeword CW1 are stored on the first page of partitions 0-7 and the remaining two pages are stored on the ninth page of partitions 8 and 9. As a result, the controller 115 can concurrently read each page of CW1 from separate partitions, thereby improving access latency for individual codewords.

Figure 6:
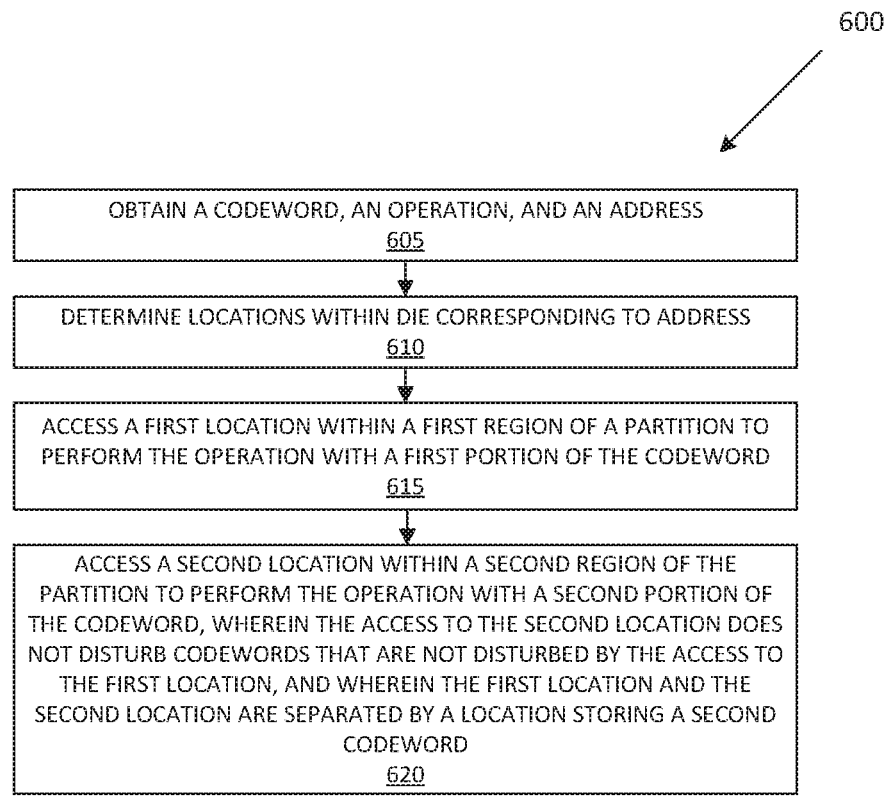
FIG. 6 is a flow diagram of an example method to map codewords to memory in accordance with some embodiments of the present disclosure.

FIG. 6 is a flow diagram of an example method 600 to map codewords to memory in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the media mapper component 113 or the controller 115 in conjunction with the media mapper component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 605, the processing device obtains a codeword, an operation, and an address. For example, the host system 120 issues a write operation to a logical address with some amount of user data to the memory subsystem 110. The processing device receives user data and forms one or more codewords (e.g., by encoding the user data with control data). Depending on the size of the codeword and the media architecture, the processing device divides the codeword into a first, bulk portion and a second, remainder portion based on the number of partitions and size of the codeword, as described above for the various exemplary codewords (e.g., the 40-, 37-41-, and 10-page codewords).

At block 610, the processing device translates or converts the logical address into multiple locations within the media for each portion of the codeword. The media locations associated with any particular logical address depend on the particular clustering of memory cells for the given codeword size, such as the division of partitions into regions, the grouping of partitions into partition groups, and/or the division of partitions within a die into virtual dice. For example, in the 48-page codeword example illustrated in FIG. 3, the logical address associated with CW1 maps the bulk portion of the codeword to first and second pages (pages 0 and 1) of the bulk region of each of the partitions within partition groups 380 and 390, and the remainder portion of the codeword to the first page (page 3277) of the remainder region in each of the partitions within partition group 380. As another example, the 10-page codeword example illustrated in FIG. 5, the logical address associated with CW1 maps the bulk portion of the codeword to the first page of the bulk region of each of the partitions within virtual die 505 and the remainder portion of the codeword to the first page of the remainder region of the first group of partitions (group 527-5) within virtual die 510.

At block 615, the processing device accesses a first location within a first region (e.g., a memory cell within an array within a partition within a die) to perform the operation with a first portion of the codeword. For example, the processing device may write the remainder portion of the codeword or the bulk portion of the codeword to a location in the corresponding region as illustrated in FIG. 3, 4, or 5.

At block 620, the processing device accesses a second location within a second region to perform the operation with a second portion of the codeword. For example, the processing device may write the portion of the codeword that was not written at block 615 to a location in the corresponding region as illustrated in FIG. 3, 4, or 5. The accesses at blocks 615 and 620 are to locations with disturb relationships such that the ideal maximum number of disturb relationships is not exceeded, while the two locations are separated by another location storing data from a different codeword. Referring to FIG. 3 for an example, a write to an aggressor page (or aggressor memory cell) at a bitline/wordline intersection disturbs a maximum of four neighboring victims (to the north, south, east, and west). A write to the location marked CW6 in bulk region 340 (addresses 5732 and 5733) disturbs four neighboring codewords: a codeword located to the west (CW3 at addresses 1636 and 1637), a codeword located to the north (not shown, but at address 5731), a codeword located to the east (not shown, but at addresses 9828 and 9829), and a codeword located to the south (CW10 at address 5734). Similarly, a write to the location marked CW6 in remainder region 360 (address 8191) disturbs three neighboring codewords, each of which was disturbed by the write to the location marked CW6 in bulk region 340 (a codeword located to the west (CW3 at address 4095), the same codeword located to the north (not shown, but at address 8190), and the same codeword located to the east (not shown, but at addresses 12287).

Figure 7:
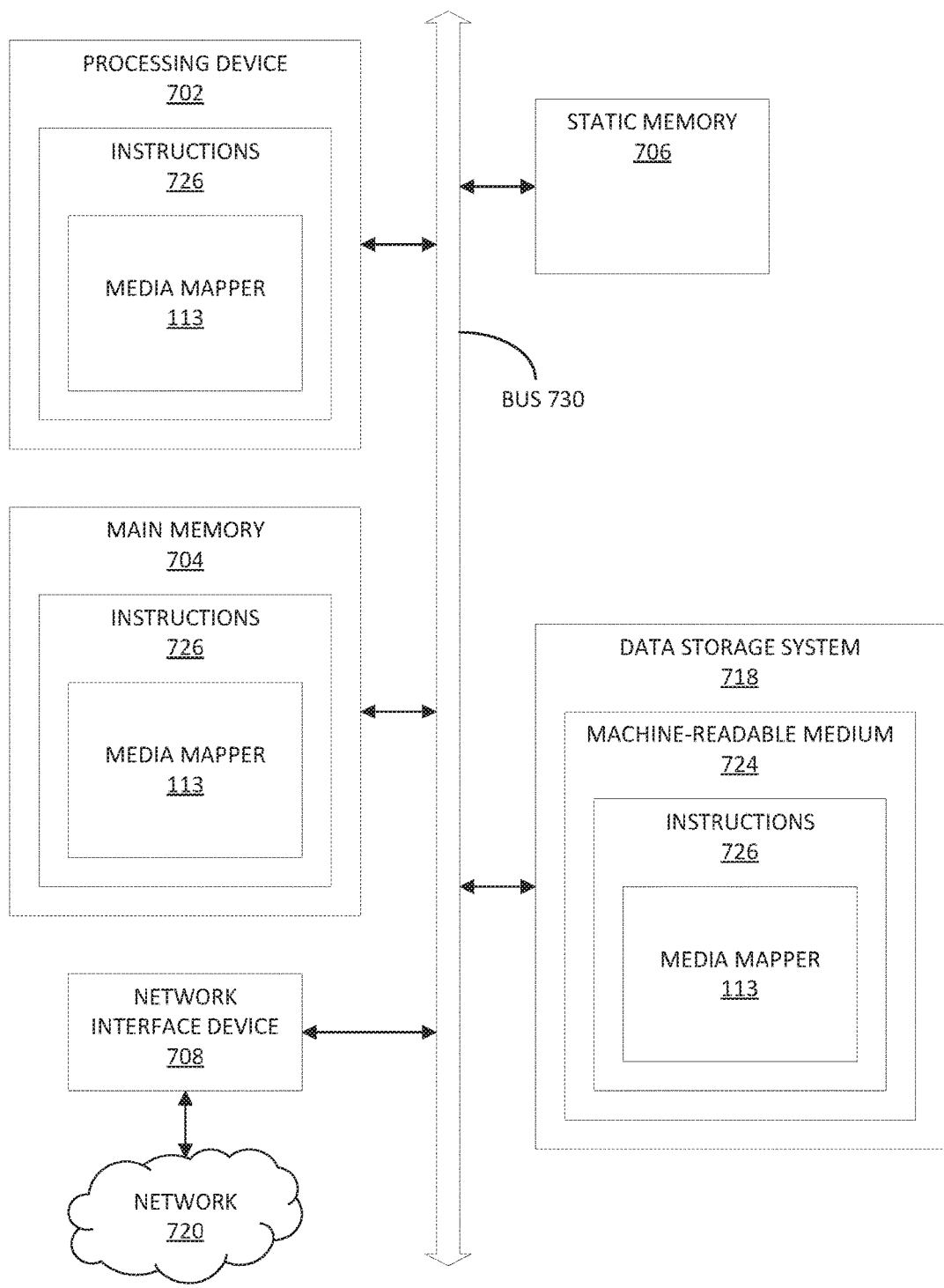
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the media mapper component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory subsystem 110 of FIG. 1.

In one embodiment, the instructions 726 include instructions to implement functionality corresponding to the media mapper component (e.g., the media mapper component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented method 600 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    writing a first bit of an aggressor codeword to a first memory cell, wherein the write to the first memory cell disturbs a set of one or more victim codewords by contributing to a cumulative effect that can change a value of a victim codeword in the set based on proximity to the first memory cell;
    writing a second bit of the aggressor codeword to a second memory cell, wherein the write to the second memory cell disturbs at most the one or more victim codewords of the set by contributing to the cumulative effect based on proximity to the second memory cell; and
    wherein the second memory cell is separated from the first memory cell by at least a third memory cell, wherein the third memory cell stores a first bit of a second codeword.

2. The method of claim 1, wherein the second memory cell is further separated from the first memory cell by at least a fourth memory cell, wherein the fourth memory cell does not store data of a codeword.

3. The method of claim 1, wherein a total number of memory cells separating the first memory cell and the second memory cell is based on a size of the aggressor codeword.

4. The method of claim 1, further comprising:
    writing a first portion of the aggressor codeword across each of N partitions of a memory die, where N is a number of partitions on the memory die and is greater than one, and wherein the first portion of the aggressor codeword includes the first bit; and
    writing a second portion of the aggressor codeword across each of M partitions of the memory die, where M is greater than or equal to one and less than N, and wherein the second portion of the aggressor codeword includes the second bit.

5. The method of claim 1, further comprising:
    writing a third bit of the aggressor codeword to a fourth memory cell;
    writing a fourth bit of the aggressor codeword to a fifth memory cell, wherein the fifth memory cell is separated from the fourth memory cell by at least a sixth memory cell, wherein the sixth memory cell stores a second bit of the second codeword; and
    wherein the first memory cell, the second memory cell, and the third memory cell are on a first partition of a memory die and the fourth memory cell, the fifth memory cell, and the sixth memory cell are on a second partition of the memory die.

6. The method of claim 1, wherein the first memory cell and the second memory cell are at different page locations within different partitions of a memory die.

7. The method of claim 1, wherein the set includes a first victim codeword that includes data that is stored in a first victim memory cell offset in a first dimension from the first memory cell and data that is stored in a second memory cell offset in the first dimension from the second memory cell.

8. A non-transitory computer-readable storage medium comprising instructions that, when executed by a processing device, cause the processing device to:
   write a first bit of an aggressor codeword to a first memory cell, wherein the write to the first memory cell disturbs a set of one or more victim codewords by contributing to a cumulative effect that can change a value of a victim codeword in the set based on proximity to the first memory cell;
   write a second bit of the aggressor codeword to a second memory cell, wherein the write to the second memory cell disturbs at most the one or more victim codewords of the set by contributing to the cumulative effect based on proximity to the second memory cell; and
   wherein the second memory cell is separated from the first memory cell by at least a third memory cell, wherein the third memory cell stores a first bit of a second codeword.

9. The non-transitory computer-readable storage medium of claim 8, wherein the second memory cell is further separated from the first memory cell by at least a fourth memory cell, wherein the fourth memory cell does not store data of a codeword.

10. The non-transitory computer-readable storage medium of claim 8, wherein a total number of memory cells separating the first memory cell and the second memory cell is based on a size of the aggressor codeword.

11. The non-transitory computer-readable storage medium of claim 8, wherein the processing device is further to:
   write a first portion of the aggressor codeword across each of N partitions of a memory die, where N is a number of partitions on the memory die and is greater than one, and wherein the first portion of the aggressor codeword includes the first bit; and
   write a second portion of the aggressor codeword across each of M partitions of the memory die, where M is greater than or equal to one and less than N, and wherein the second portion of the aggressor codeword includes the second bit.

12. The non-transitory computer-readable storage medium of claim 8, wherein the processing device is further to:
   write a third bit of the aggressor codeword to a fourth memory cell;
   write a fourth bit of the aggressor codeword to a fifth memory cell, wherein the fifth memory cell is separated from the fourth memory cell by at least a sixth memory cell, wherein the sixth memory cell stores a second bit of the second codeword; and
   wherein the first memory cell, the second memory cell, and the third memory cell are on a first partition of a memory die and the fourth memory cell, the fifth memory cell, and the sixth memory cell are on a second partition of the memory die.

13. The non-transitory computer-readable storage medium of claim 8, wherein the first memory cell and the second memory cell are at different page locations within different partitions of a memory die.

14. The non-transitory computer-readable storage medium of claim 8, wherein the set includes a first victim codeword that includes data that is stored in a first victim memory cell offset in a first dimension from the first memory cell and data that is stored in a second memory cell offset in the first dimension from the second memory cell.

15. A system comprising:
   a memory component; and
   a processing device, operatively coupled with the memory component, configured to:
      write a first bit of an aggressor codeword to a first memory cell, wherein the write to the first memory cell disturbs a set of one or more victim codewords by contributing to a cumulative effect that can change a value of a victim codeword in the set based on proximity to the first memory cell;
      write a second bit of the aggressor codeword to a second memory cell, wherein the write to the second memory cell disturbs at most the one or more victim codewords of the set by contributing to the cumulative effect based on proximity to the second memory cell; and
      write a first bit of a second codeword to a third memory cell; and
      wherein the second memory cell is separated from the first memory cell by at least a third memory cell and the set includes a first victim codeword that includes data that is stored in a first victim memory cell offset in a first dimension from the first memory cell and data that is stored in a second memory cell offset in the first dimension from the second memory cell.

16. The system of claim 15, wherein the second memory cell is further separated from the first memory cell by at least a fourth memory cell, wherein the fourth memory cell does not store data of a codeword.

17. The system of claim 15, wherein a total number of memory cells separating the first memory cell and the second memory cell is based on a size of the aggressor codeword.

18. The system of claim 15, wherein the processing device is further to:
   write a first portion of the aggressor codeword across each of N partitions of a memory die, where N is a number of partitions on the memory die and is greater than one, and wherein the first portion of the aggressor codeword includes the first bit; and
   write a second portion of the aggressor codeword across each of M partitions of the memory die, where M is greater than or equal to one and less than N, and wherein the second portion of the aggressor codeword includes the second bit.

19. The system of claim 15, wherein the processing device is further to:
   write a third bit of the aggressor codeword to a fourth memory cell;
   write a fourth bit of the aggressor codeword to a fifth memory cell, wherein the fifth memory cell is separated from the fourth memory cell by at least a sixth memory cell, wherein the sixth memory cell stores a second bit of the second codeword; and
   wherein the first memory cell, the second memory cell, and the third memory cell are on a first partition of a memory die and the fourth memory cell, the fifth memory cell, and the sixth memory cell are on a second partition of the memory die.

20. The system of claim 15, wherein the first memory cell and the second memory cell are at different page locations within different partitions of a memory die.

* * * * *